(12) United States Patent
Wu et al.

(10) Patent No.: US 7,949,919 B2
(45) Date of Patent: May 24, 2011

(54) MICROELECTRONIC DEVICE AND PIN ARRANGEMENT METHOD THEREOF

(75) Inventors: Hsiang-Huang Wu, Taipei (TW);
Ming-Je Li, Yilan County (TW);
Jih-Nung Lee, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 59 days.

(21) Appl. No.: 12/287,831

(22) Filed: Oct. 14, 2008

(65) Prior Publication Data
US 2009/0106611 A1    Apr. 23, 2009

(30) Foreign Application Priority Data

Oct. 19, 2007   (TW) ............................... 96139299 A

(51) Int. Cl.
*G01R 31/28*    (2006.01)

(52) U.S. Cl. .......... 714/727; 714/30; 714/724; 714/726; 714/729

(58) Field of Classification Search ........................ None
See application file for complete search history.

(56) References Cited

U.S. PATENT DOCUMENTS

| | | | | |
|---|---|---|---|---|
| 5,412,260 | A * | 5/1995 | Tsui et al. ........................ | 326/39 |
| 7,181,359 | B2 * | 2/2007 | Goyal .............................. | 702/117 |
| 2007/0011546 | A1 * | 1/2007 | Whetsel ......................... | 714/742 |
| 2007/0143653 | A1 * | 6/2007 | Doorenbos et al. ........... | 714/726 |

* cited by examiner

*Primary Examiner* — John P Trimmings
(74) *Attorney, Agent, or Firm* — Thomas, Kayden, Horstemeyer & Risley, LLP

(57) ABSTRACT

The present invention provides a microelectronic device with a circuit core and a boundary scan test interface sharing a number of pre-selected pins. In the mode of a boundary scan test, the boundary scan test interface manipulates the input and output of the test signal through the shared pins. Pins necessary for the microelectronic device are therefore reduced.

14 Claims, 4 Drawing Sheets

MICROELECTRONIC DEVICE AND PIN ARRANGEMENT METHOD THEREOF

BACKGROUND

1. Field of the Invention

The present invention relates to a microelectronic device, and in particular, to a microelectronic device provided with an integrated circuit core and a boundary scan test interface, which share a number of pre-selected pins.

2. Description of Related Art

In a printed circuit board (PCB) on which a plurality of microelectronic devices such as integrated circuits (ICs) are mounted, an interconnection test is required to assure correct interconnections between respective ICs on the board. For example, the Boundary Scan test which is compliant with IEEE 1149.1 standard A is a typical measure for such an interconnection test.

In general, the microelectronic device includes an IC core for execution of main functions, and a boundary scan test interface for testing. FIG. 1 illustrates an example of a conventional microelectronic device 100, which comprises an IC core 101, a boundary scan test interface architecture for boundary scan tests, and pins dedicated to the architecture. As shown in FIG. 1, the boundary scan test interface includes a test access port (TAP) controller 102, an instruction register 103, a bypass register 104, and boundary scan units 105. In FIG. 1, there are five pins dedicated to the boundary scan test, which are pin TDI, pin TDO, pin TCK, pin TMS, and pin TRST, respectively. In other function modes of the microelectronic device 100, these pins are not to be used. When the boundary scan test mode is performed, the pin TDI is used for inputting serial data, the pin TDO is used for outputting serial data, the pin TMS is used for selecting input, the pin TCK is used for clock input, and the pin TRST is used for resetting the system. Among these pins, the pin TRST is not essential and may be used or removed depending on the design.

Generally, the TAP controller 102 enters the scan test mode based on a signal input from the pin TMS. For example, when the signal input to the pin TMS is 0 (low level), the TAP controller 102 enters the boundary scan test mode. In the boundary scan test mode, the TAP controller 102 controls serial test data to be input from the pin TDI and output to another electronic device via a scan chain formed with a plurality of boundary scan units 105, in order to test whether the interconnection between the microelectronic device 100 and the electronic device is normal. After completing such tests, if the microelectronic device operates in the normal operation mode, the boundary scan test interface does not have to be functional any more and these dedicated pins are then idle. In other words, these pins are redundant in the operation modes other than the boundary scan test mode.

As to functions of the instruction register 103, the bypass register 104, and the boundary scan units 105 in the boundary scan test mode, please refer to the IEEE 1149.1 standard. Detailed explanations are omitted here for the sake of brevity.

The number of pins consumed affects the fabrication cost of IC chips. In other words, the greater the number is, the higher the cost is. Therefore, if the number of pins necessary for an IC chip can be reduced, the fabrication cost can be reduced significantly.

SUMMARY

In view of the above, the present invention provides a microelectronic device having pins shared by the boundary scan test mode and other modes.

In addition, another object of the present invention is to provide a pin arrangement method capable of reducing the cost.

According to one aspect, the present invention provides a microelectronic device comprising (a) an IC core, and (b) a boundary scan test interface sharing with the IC core a pre-selected number of pins, each of which can be switched between the scan test mode and a normal function operation mode. In one preferred embodiment, the interface includes (b1) one mode selection input pin, and (b2) a test access port controller, which activates the boundary scan test mode to route the test signal so as to be input or output through the pre-selected shared pins, based on an mode selection signal input from the mode selection input pin.

According to the present invention, the boundary scan test interface further includes a test signal route selector to decide whether the pre-selected shared pins are in the boundary scan test mode or the normal function operation mode, or/and whether the pre-selected shared pins are input pins or output pins. The test signal route selector makes the decision based on a state of the test access port controller, or a result of a logical operation of the state of the test access port controller with the mode selection signal.

The number of the shared pins may be 1, 2, 3, or 4. In the test mode, the shared pins may function as data input pins, data output pins, clock input pins, or system reset input pins.

Further, the present invention provides a pin arrangement method of a microelectronic device comprising the steps of: providing the microelectronic device having pins for a boundary scan test mode and a normal function operation mode; arranging one of the pins to function as a data input pin, a data output pin, a clock input pin, or a system reset input pin in the boundary scan test mode; and arranging the pin to function as a normal function pin.

In the accompanying drawings and the following descriptions, details of one or more embodiments of the present invention will be illustrated. The abovementioned and other objects, features, and advantages of the present invention will be more readily apparent from the following description, drawing, and appended claims.

BRIEF DESCRIPTION OF THE DRAWINGS

In the accompanying drawings.

DESCRIPTION OF THE PREFERRED EMBODIMENTS

In the detailed descriptions below, various details will be disclosed to be contributory to the complete understanding of the present invention. However, those having ordinary knowledge of this field can implement the present invention without using specific details disclosed below. Therefore, any alternatives, modifications, or changes of the embodiments illustrated should be considered to be within the scope of the present invention.

Figure 1:
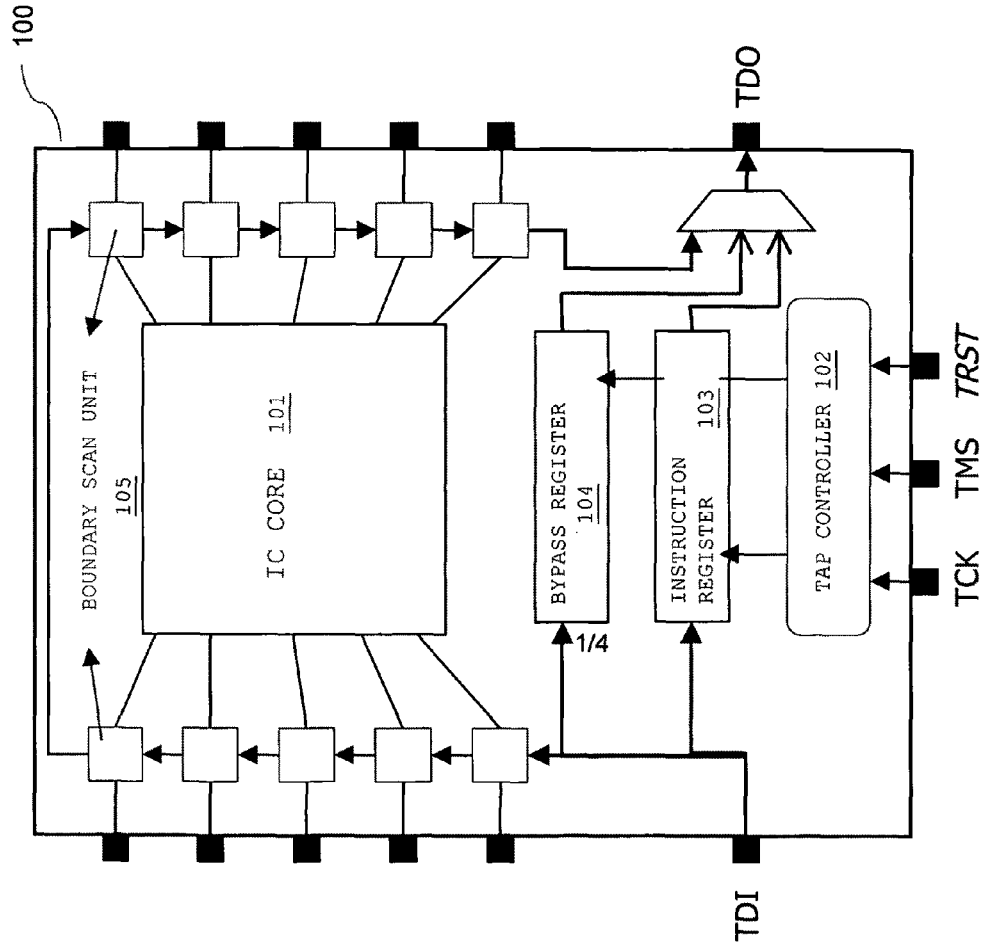
FIG. 1 shows a conventional microelectronic device having boundary scan test interface.
Figure 2:
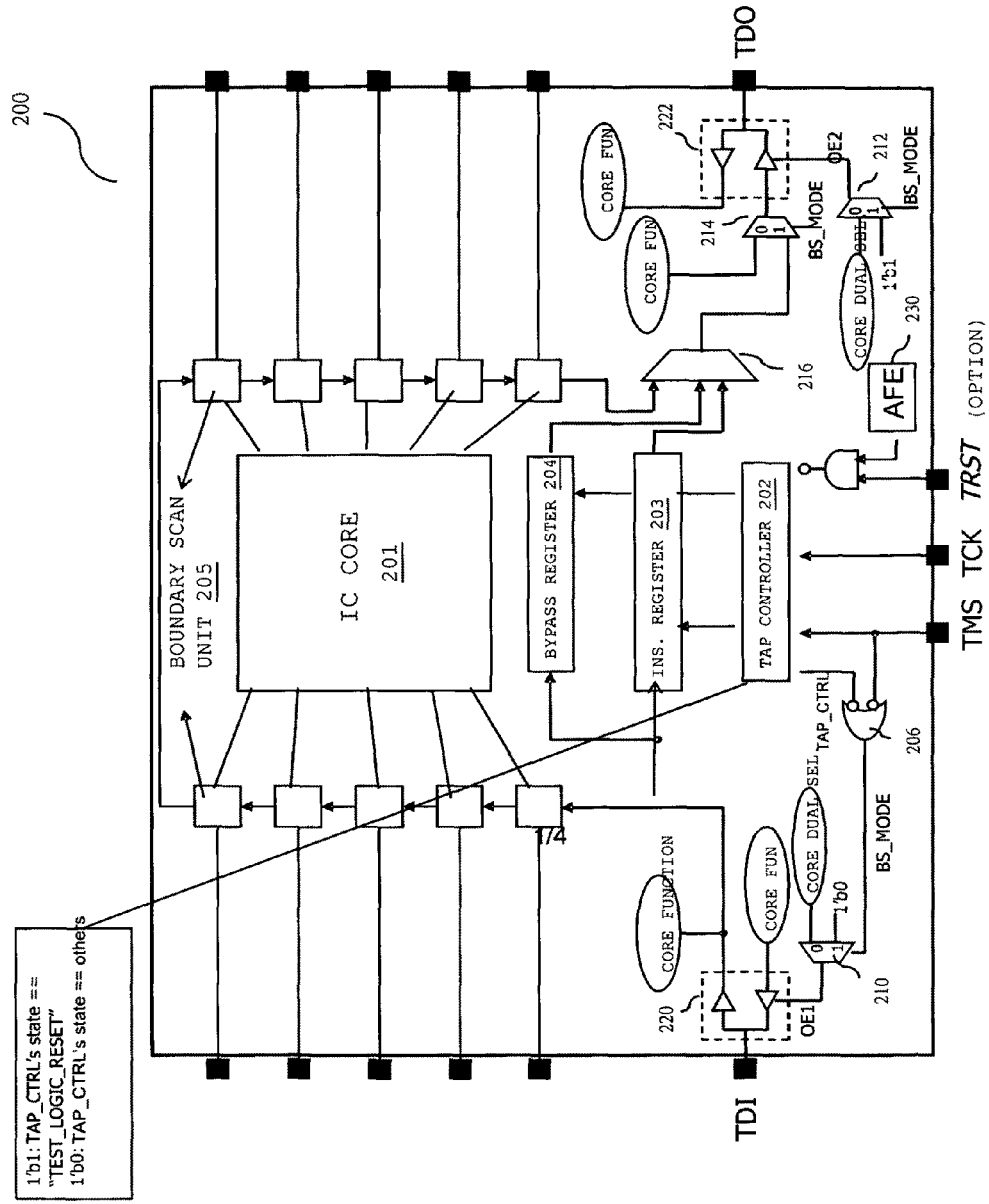
FIG. 2 shows a microelectronic device having boundary scan test interface according to one embodiment of the present invention.
Figure 3:
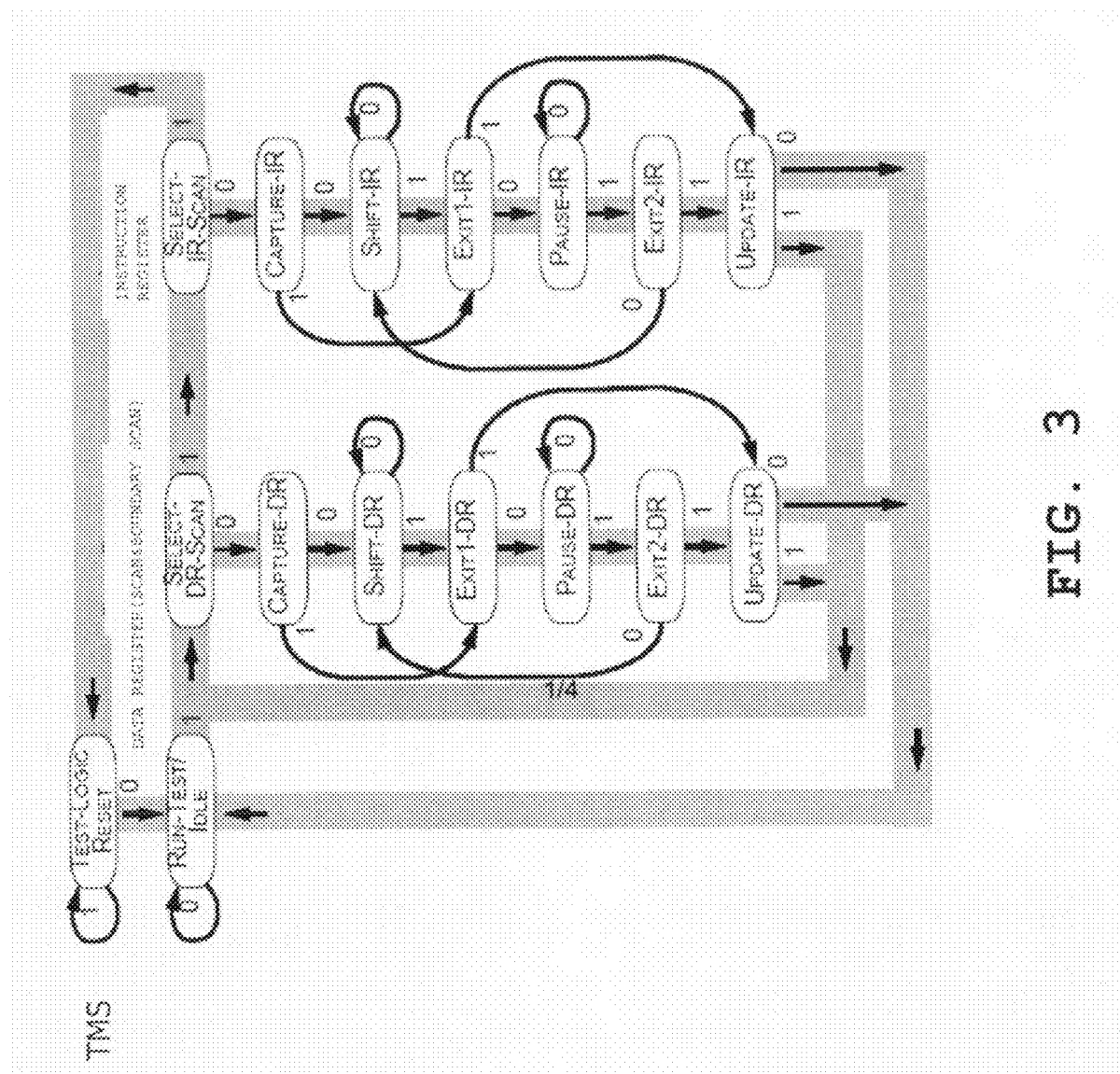
FIG. 3 shows a state diagram of a state machine of a test access port (TAP) controller.

First, please refer to FIGS. 2 and 3. FIG. 2 shows a microelectronic device 200 according to one embodiment of the present invention. FIG. 3 is a state diagram for illustrating a state of a state machine of a test access port controller (abbreviated to TAP hereinafter) shown in FIG. 2.

As shown in FIG. 2, the microelectronic device 200 comprises an integrated circuits (IC) core 201 for executing normal operation functions, a tap controller 202, an instruction register 203, a bypass register 204, a boundary scan unit 205, an OR gate 206, and multiplexers 210, 211, and 214.

In FIG. 2, some pins are denoted by the abbreviations of TDI, TDO, TCK, and TRST for the convenience of explanation. However, these pins in contrast to the conventional pins are portrayed differently according to embodiments of the present invention. Instead of using the conventional pins for only the boundary scan test mode, these pins can be shared by the boundary scan mode and the normal function operation mode of the IC core 201. In the normal function operation mode, they may function as one-way input pins, one-way output pins, or bi-direction (input/output) pins in order to work in cooperation with the normal function operation mode of IC core 201. In this embodiment, an example is given that a bi-direction pin is used to function as the TDI and TDO pin in the boundary scan test mode. However, it should be noted that the one-way input pin and the one-way output pin may also be selected as the TDI pin and the TDO pin in the boundary scan test mode, respectively. It should be noted that depending on the requirements of a certain IC, one could select a one-way pin or a bi-direction pin to function as a desired switchable pin.

Please refer to FIG. 3. FIG. 3 shows a switch operation between the boundary scan test mode (also called as the JTAG mode) and the normal operation mode of the microelectronic device 200. As discussed previously, the interconnection test is performed on the microelectronic device and other IC or electronic device in the boundary scan test mode, while the IC core performs its function operation in the operation modes other than the boundary test mode.

As shown in FIG. 3, when an external signal input from the TMS pin is 0, the state machine exits from the Test_Logic_Reset state, and enters into the Run_Test/Idle state, i.e. the boundary scan test mode. Upon starting, the microelectronic device 200 outputs a signal from an analog front end device (AFE) 230 shown in FIG. 2, in order to activate the TAP controller 202 to enter into the Test_Logic_Reset state.

The state signal TAP_CTRL indicates the state of the TAP controller 202. The state signal TAP_CTRL is 1 (high level) when the microelectronic device 200 is in the normal function operation mode, and the state signal TAP_CTRL is 0 (low level) when it enters the boundary scan test mode. In FIG. 2, 1'b1 (high level) indicates that this state signal is in Test_Logic_Reset, and 1'b0 (low level) indicates that this state signal is in the boundary scan test mode. At this time, since the logic gate 206 receives the state signal TAP_CTRL as one input and receives the TMS signal as the other input, its output signal BS_MODE is 1 (high level). The logic gate 206 may be an OR gate receiving an inverted signal, or an equivalent NAND gate. When the signal BS_MODE is 1, the multiplexers 210 and 212 will select 1'b0 and 1'b1 as their outputs OE1 and OE2, respectively, and accordingly the output OE1 is low level and the output OE2 is high level.

As shown in FIG. 2, a bi-direction circuit 220 connected to the pin TDI is controlled by the output OE1(=0) to make the pin TDI to function as an signal input pin, while a bi-direction circuit 222 connected to the pin TDO is selected by the output OE2(=1) so as to make the pin TDO function as the signal output pin. The multiplexer 214 is activated by the signal BS_MODE to select a signal output from the multiplexer 216 (i.e. the signal input from the pin TDI) as its output signal.

If the state of the TAP controller is the Test_Logic_Reset state, then the output signal BS_MODE of the logic gate 206 is 0, and accordingly the multiplexers 210 and 212 are not activated. In this situation, the selected pins TDI and TDO may be used in the other modes. In brief, all of the shared pins are in the boundary scan test mode when the output signal BS_MODE is 1, and in the normal function operation mode when the output signal BS_MODE is 0.

The other states of the state machine shown in FIG. 3 are used as examples only for explaining the operation of the boundary scan test. Therefore, the figure is provided to those skilled in this field for reference and details of the boundary scan test are not discussed herein.

In the above descriptions about this embodiment, although the bi-direction pins are used as the shared pins TDI and TDO, various combinations of the pins suitable for the shared pin TDI and TDO are still within the scope of the present invention. For example, the one-way input pin and the one-way output pin, the one-way input pin and the bi-direction output pins, or the bi-direction pin and the one-way output pin may be used as the shared pins TDI and TDO, respectively.

The pins TCK and TRST shown in FIG. 2 may also be selected as the shared pins; nonetheless, the pin TRST may be removed eventually depending on the requirements of the design since it is not necessary at all. For simplicity, the hardware structures for the shared pins TCK and TRST are not shown in the figure since they share similar structures as the circuits for pins TDI and TDO. It should be noted that the design of the logic gate 206 is provided for the situation that the pin TCK is designed as a shared pin. If the pin TCK is designed as an unshared pin, the logic gate 206 does not have to exist. In detail, since the TAP controller 202 operates based on the clock signal TCK, its state is kept in the Test_Logic_Reset at the initial stage of the circuit if the pin TCK is not shared, and accordingly the pin TCK is kept as the normal function pin, and does not provide the test clock signal to the TAP controller 202. In this situation, the TAP controller 202 will not change its state because it does not receive the test clock signal TCK. Thus, according to this embodiment, the pin TCK is switched from the normal function mode to the boundary scan test mode based on the TMS signal, thereby to change the state of the TAP controller 202. If the pin TCK is not shared or is switched in other ways so as to make the TAP controller 202 able to receive the test clock signal, then it is not necessary to provide the logic gate 206. Such cases are apparently still within the scope of the present invention.

Figure 4:
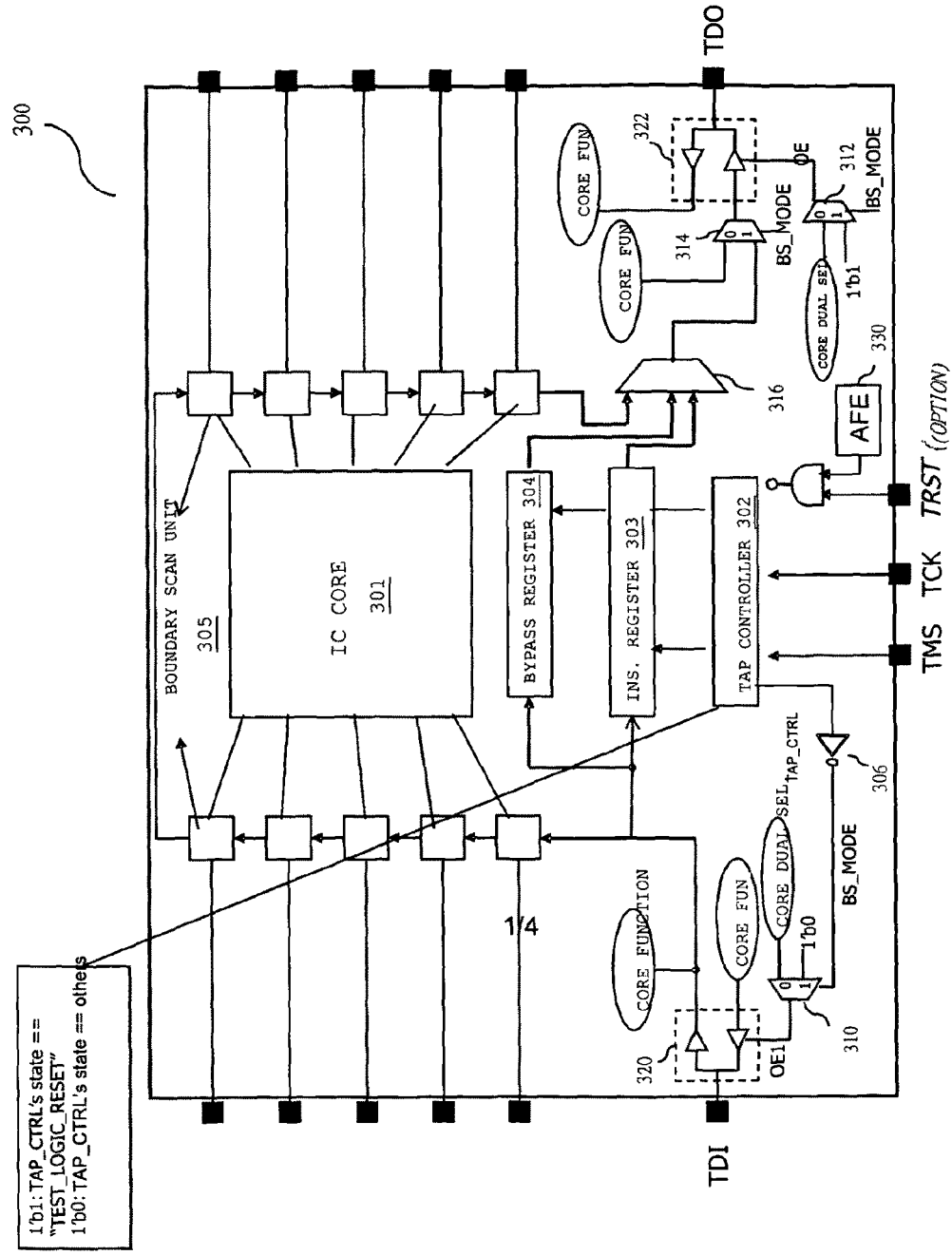
FIG. 4 shows a microelectronic device having boundary scan test interface according to another embodiment of the present invention.

FIG. 4 shows a microelectronic device according to another embodiment of this invention. The microelectronic device 300 shown in FIG. 4 is different from that shown in FIG. 3 in that an inverter 306 replaces the OR gate 206 receiving the inverted input. The other parts shown in FIG. 4 are similar to those in FIG. 3 and descriptions of such similar structures are not repeated here. The state control signal TAP_CTRL is inverted into the BS_MODE signal by the inverter 306. However, in this embodiment, the operation modes of pins are not switched based on the TMS signal. In this embodiment, the inverter 306 for replacing the OR gate 206 is give as one example only. If the state signal of the TAP controller 202 indicates a contrary meaning, the inverter 306 can be omitted.

According to the present invention, the microelectronic device can allow the pin TMS to be used only in the boundary scan test mode, and the other pins TDI, TDO, TCK, and TRST to be shared by the boundary scan test mode and the other function modes, i.e. by the IC core and the boundary scan test interface, depending on the design requirements. Further, since the shared pins may be one-way or bi-direction pins, the present invention can provide a designer with greater design flexibility. Thus, according to the present invention, since many predetermined pins can be shred by the boundary scan test mode and the general function operation mode, the cost of the microelectronic device can be reduced.

While the present invention has been explained with reference to preferred embodiments, the description is illustrative of the invention only to help those skilled in this art to understand the present invention, and is not to be construed as limiting the invention. Various modifications and variations may be made by those skilled in this art without departing the spirits of the present invention. In view of the foregoing, it is intended that the present invention cover all such modifications and variations, which should be interpreted to fall within the scope defined by the appended claims and their equivalents.

What is claimed is:

1. A microelectronic device comprising:
   an IC core;
   a boundary scan test interface sharing with the IC core a pre-selected number of pins, which include at least one shared pin being switchable between a scan test mode and a normal function operation mode;
   a test access port controller for activating the boundary scan test mode to route a test signal to be input or output through the pre-selected shared pins in response to a mode selection signal;
   at least one bi-directional circuit connected to the at least one shared pin, the at least one bi-directional circuit having a control input that determines whether the shared pin functions as an input or an output; and
   a multiplexer having an output that is connected to the control input of the at least one bi-directional circuit, the multiplexer having a control input that is determined by a logical combination of the mode selection signal and a reset state of the test access port controller.

2. The microelectronic device as claimed in claim 1, wherein the boundary scan test mode further includes:
   a test signal route selector adapted to decide whether the pre-selected shared pins are in the boundary scan test mode or the normal function operation mode.

3. The microelectronic device as claimed in claim 2, wherein the test signal route selector decides whether the pre-selected shared pins are in the boundary scan test mode or the normal function operation mode, based on a result of a logical operation of the reset state of the test access port controller with the mode selection signal.

4. The microelectronic device as claimed in claim 3, wherein the test signal route selector includes:
   a logic gate for receiving a signal representing the reset state of the test access controller and the mode selection signal, and outputting a route control signal; and
   a multiplexer for routing the test signal to be input or output through the pre-selected shared pins.

5. The microelectronic device as claimed in claim 4, wherein the logical gate includes at least one of an OR gate and a NAND gate.

6. The microelectronic device as claimed in claim 1, wherein the pre-selected number is smaller than that specified by the IEEE 1149.1 standard.

7. The microelectronic device as claimed in claim 1, wherein the pre-selected number is 1, 2, 3, or 4.

8. The microelectronic device as claimed in claim 1, wherein, in the boundary scan test mode, the pre-selected number of pins have at least one of data input function, data output function, clock input function, or system reset input function.

9. The microelectronic device as claimed in claim 1, wherein at least one of the pre-selected number of pins is a one-way output pin.

10. The microelectronic device as claimed in claim 1, wherein at least one of the pre-selected number of pins is a bi-direction input/output pin.

11. The microelectronic device as claimed in claim 10, wherein the bi-direction input/output pin can be set as an input pin or an output pin.

12. The microelectronic device as claimed in claim 11, wherein the bi-direction input/output pin can be determined as the input pin or the output pin based on the state of the test access port controller.

13. The microelectronic device as claimed in claim 12, wherein the bi-direction input/output pin can be determined as the input pin or the output pin based on a result of logical operation of the state of the test access port controller with the mode selection signal.

14. A pin arrangement method of a microelectronic device comprising the steps of:
   providing the microelectronic device having pins for a boundary scan test mode and a normal function operation mode;
   arranging at least one of the pins to function as one of a data input pin, a data output pin, a clock input pin, or a system reset input pin in the boundary scan test mode;
   arranging said pin to function as a normal function pin in the normal operation mode;
   providing a mode selection signal to enable said in to be switched between the boundary scan test mode and the normal function operation mode;
   providing one test access port controller in the microelectronic device; and
   enabling said in to be switched between the boundary scan test mode and the function operation mode based on a result of a logical operation of the state of the test access port controller with the mode selection signal.

* * * * *